US010431599B2

(12) United States Patent
Lee et al.

(10) Patent No.: US 10,431,599 B2
(45) Date of Patent: Oct. 1, 2019

(54) SUBSTRATE FOR DISPLAY DEVICE AND DISPLAY DEVICE INCLUDING THE SAME

(71) Applicant: LG Display Co., Ltd., Seoul (KR)

(72) Inventors: Jong-Won Lee, Seoul (KR); Jeong-Oh Kim, Goyang-si (KR); Jung-Ho Bang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/833,803

(22) Filed: Dec. 6, 2017

(65) Prior Publication Data

US 2018/0182832 A1 Jun. 28, 2018

(30) Foreign Application Priority Data

Dec. 28, 2016 (KR) .................. 10-2016-0181058

(51) Int. Cl.
| | |
|---|---|
| *H01L 27/15* | (2006.01) |
| *H01L 21/00* | (2006.01) |
| *H01L 27/12* | (2006.01) |
| *H01L 51/52* | (2006.01) |
| *H01L 27/32* | (2006.01) |

(52) U.S. Cl.
CPC ...... *H01L 27/1222* (2013.01); *H01L 27/1225* (2013.01); *H01L 27/1248* (2013.01); *H01L 27/1255* (2013.01); *H01L 27/3246* (2013.01); *H01L 51/5206* (2013.01)

(58) Field of Classification Search
CPC .................................................. H01L 27/1222
USPC ............................................. 438/36; 257/86
See application file for complete search history.

(56) References Cited

U.S. PATENT DOCUMENTS

| | | | |
|---|---|---|---|
| 2012/0256973 A1* | 10/2012 | Choi ................... | H01L 51/5253 345/690 |
| 2013/0153904 A1 | 6/2013 | Nishimura et al. | |
| 2015/0108465 A1* | 4/2015 | Koyama ............ | H01L 27/3258 257/40 |
| 2015/0243724 A1 | 8/2015 | Cho et al. | |
| 2016/0349559 A1* | 12/2016 | Woo .................... | G02F 1/13338 |

(Continued)

FOREIGN PATENT DOCUMENTS

KR 10-2016-0043327 A 4/2016

OTHER PUBLICATIONS

European Patent Office, Extended European Search Report and Opinion, EP Patent Application No. 17208678.7, dated Jun. 6, 2018, eight pages.

*Primary Examiner* — Calvin Lee
(74) *Attorney, Agent, or Firm* — Fenwick & West LLP

(57) ABSTRACT

A substrate for a display device and a display device including the same are disclosed. The substrate includes a first thin-film transistor including an oxide semiconductor layer, a second thin-film transistor spaced apart from the first thin-film transistor and including a polycrystalline semiconductor layer, and a storage capacitor including at least two storage electrodes. One of the at least two storage electrodes is located in the same layer and is formed of the same material as a gate electrode of the second thin-film transistor that is disposed under the polycrystalline semiconductor layer, and another one of the at least two storage electrodes is located above the polycrystalline semiconductor layer with at least one insulation film interposed therebetween. Accordingly, lower power consumption and a larger area of the substrate are realized.

26 Claims, 16 Drawing Sheets

(56) References Cited

U.S. PATENT DOCUMENTS

| | | | | |
|---|---|---|---|---|
| 2017/0294456 A1* | 10/2017 | Lee | .................... | H01L 21/02164 |
| 2018/0006102 A1* | 1/2018 | Oh | ...................... | H01L 27/3262 |
| 2018/0061868 A1* | 3/2018 | Na | ...................... | H01L 27/1251 |
| 2018/0175127 A1* | 6/2018 | Lee | ..................... | H01L 27/1255 |

* cited by examiner

SUBSTRATE FOR DISPLAY DEVICE AND DISPLAY DEVICE INCLUDING THE SAME

CROSS-REFERENCE TO RELATED APPLICATIONS

This application claims priority to Republic of Korea Patent Application No. 10-2016-0181058, filed on Dec. 28, 2016, which is hereby incorporated by reference as if fully set forth herein.

BACKGROUND

Field of the Invention

The present disclosure relates to a substrate for a display device and a display device including the same, and more particularly to a substrate for a display device, which is capable of realizing lower power consumption and a larger area, and a display device including the same.

Discussion of the Related Art

An image display device, which displays various kinds of information on a screen, is a core technology of the information and communication age, and is currently being developed with the aims of a thinner and lighter design, greater portability and higher performance. Hence, flat panel display devices, which may reduce the disadvantageously great weight and volume of a cathode ray tube (CRT), are in the spotlight.

Examples of flat panel display devices include liquid crystal display (LCD) devices, plasma display panel (PDP) devices, organic light-emitting display (OLED) devices, and electrophoretic display (ED) devices.

A flat panel display device includes thin-film transistors arranged in pixels. In order to apply a display device to portable appliances, low power consumption is required. However, it is difficult to realize low power consumption with technologies related to display devices that have been developed to date.

SUMMARY

Accordingly, the present disclosure is directed to a substrate for a display device and a display device including the same that substantially obviate one or more problems due to limitations and disadvantages of the related art.

An object of the present disclosure is to provide a substrate for a display device, which is capable of realizing lower power consumption and a larger area, and a display device including the same.

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a substrate for a display device includes a first thin-film transistor including an oxide semiconductor layer, a second thin-film transistor spaced apart from the first thin-film transistor and including a polycrystalline semiconductor layer, and a storage capacitor including at least two storage electrodes. One of the at least two storage electrodes is located in the same plane and is formed of the same material as a gate electrode of the second thin-film transistor that is disposed under the polycrystalline semiconductor layer, and another one of the at least two storage electrodes is located above the polycrystalline semiconductor layer with at least one insulation film interposed therebetween.

Embodiments also relate to a display device including a substrate and a pixel on the substrate. The pixel includes a first thin film transistor (TFT) on the substrate, a second TFT, and a light-emitting device electrically connected to the first TFT. The first TFT includes a first gate electrode on the substrate, at least a first part of a gate insulating film on the first gate electrode, a first active layer formed of polycrystalline silicon on the first part of the gate insulating film, and a first source electrode and a first drain electrode contacting a top surface of the first active layer. A bottom surface of the first active layer faces the first gate electrode. The second TFT includes a second active layer formed of oxide semiconductor.

In one embodiment, the display device further includes a first interlayer insulation film on the first active layer contacting the first active layer. The second active layer may be disposed on the first interlayer insulation film.

In one embodiment, the first interlayer insulation film is formed of silicon nitride (SiNx).

In one embodiment, the second TFT further includes a second gate electrode disposed on the first interlayer insulation film, and at least a first part of a second interlayer insulation film between the second gate electrode and the second active layer.

In one embodiment, the second interlayer insulation film is formed with a first opening. The first source electrode or the first drain electrode of the first TFT may be disposed on a side surface of the first opening.

In one embodiment, the second interlayer insulation film is on the first source electrode and the first drain electrode of the first TFT.

In one embodiment, the second TFT further includes at least a first part of a third interlayer insulation film between the second gate electrode and the second active layer. The second interlayer insulation film may contact the second active layer and may be formed of silicon oxide (SiOx). The third interlayer insulation film may contact the second gate electrode and may be formed of silicon nitride (SiNx).

In one embodiment, the second TFT further includes a second gate electrode disposed below the second active layer. A bottom surface of the second active layer faces the second gate electrode, and a second source electrode and a second drain electrode may contact a top surface of the second active layer.

In one embodiment, the second TFT further includes a second gate electrode on the second active layer. A bottom surface of the second gate electrode faces the second active layer, and a second source electrode and a second drain electrode contacts a top surface of the second active layer.

In one embodiment, the display device further includes a light-shielding layer on the substrate overlapping with the second active layer. The light-shielding layer may be in a same layer as the first gate electrode of the first TFT.

In one embodiment, the display device further includes a storage electrode on the substrate. The storage electrode may include a lower storage electrode and an upper storage electrode disposed on the lower storage electrode.

In one embodiment, the display device further includes a first interlayer insulation film on the first active layer contacting the first active layer. The storage capacitor may further include at least a first part of the first interlayer insulation film and at least a second part of the gate insulating film disposed between the lower storage electrode and the upper storage electrode.

In one embodiment, the lower storage electrode is in a same layer as the first gate electrode of the first TFT.

In one embodiment, second TFT further includes a second gate electrode. The upper storage electrode is in a same layer as the second gate electrode.

In one embodiment, the display device further includes a gate line on the substrate in a same layer as the first gate electrode. The gate line may overlap with the first active layer.

In one embodiment, the display device further includes a gate-driving unit that drives a plurality of gate lines on the substrate. The gate-driving unit may include a third TFT including a third active layer formed of polycrystalline silicon.

In one embodiment, the display device further includes a data-driving unit and a multiplexer that drives a plurality of data lines on the substrate. The multiplexer may include a third TFT including a third active layer formed of polycrystalline silicon.

In one embodiment, the light-emitting device is electrically connected to the first TFT. The first TFT is a driving TFT that drives the light-emitting device.

In one embodiment, the second TFT is a switching TFT of the pixel, and the second TFT further includes a second drain electrode electrically connected to the first gate electrode, and a second source electrode connected to a data line on the substrate.

In one embodiment, the second TFT is a sensing TFT of the pixel, and the second TFT further includes a second drain electrode electrically connected to the light-emitting device, and a second source electrode connected to a reference line on the substrate.

In one embodiment, the light-emitting includes an anode electrode, a light-emitting stack, and a cathode electrode. The anode electrode may overlap with the first TFT and the second TFT.

In one embodiment, the light-emitting device includes an anode electrode, a light-emitting stack, and a cathode electrode. The display device further includes a connection electrode electrically connected to the first drain electrode of the first TFT and the anode electrode.

In one embodiment, the light-emitting device includes an anode electrode, a light-emitting stack, and a cathode electrode. The anode electrode may include a transparent conductive film and an opaque conductive film.

In one embodiment, the light-emitting device includes an anode electrode, a light-emitting stack, and a cathode electrode. The display device may further include a bank layer on at least a part of the anode electrode. The bank layer may include a light-shielding material selected from at least one among a color pigment, and organic black and carbon materials.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
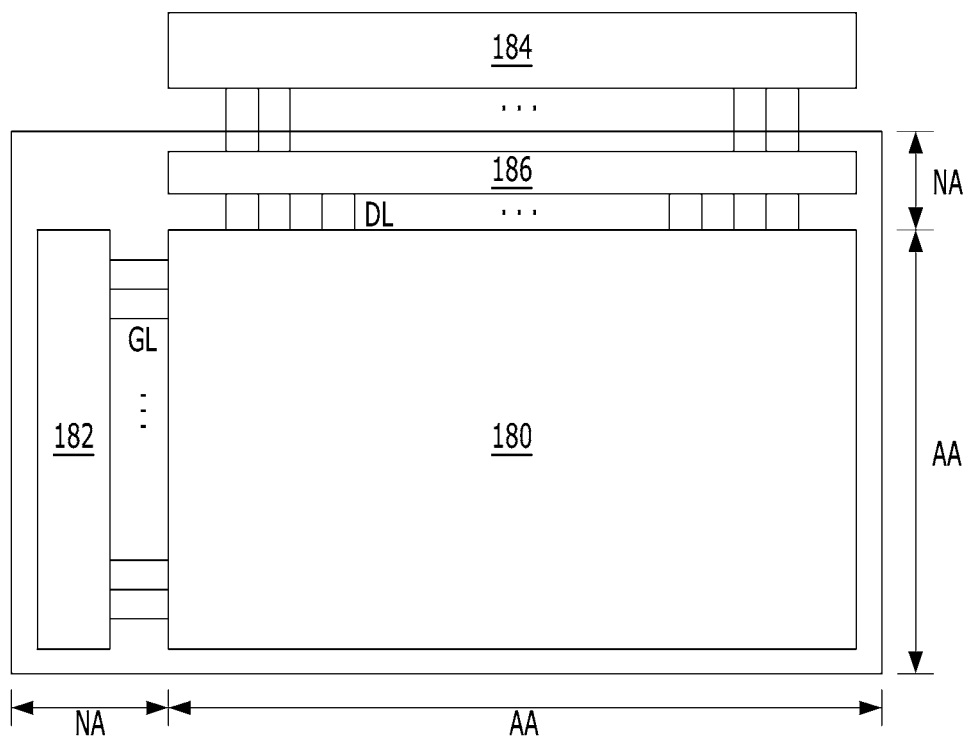
FIG. 1 is a plan view illustrating a display device according to an embodiment of the present disclosure.

FIG. 1 is a block diagram illustrating a display device according to an embodiment of the present disclosure.

The display device shown in FIG. 1 includes a display panel 180, a gate-driving unit 182 for driving gate lines GL of the display panel 180, and a data-driving unit 184 for driving data lines DL of the display panel 180.

The display panel 180 includes a display area AA and a non-display area NA surrounding the display area AA.

In the display area AA of the display panel 180, pixels are located at intersecting portions between the gate lines GL and the data lines DL. The pixels are arranged in a matrix form. Each of the pixels, as shown in FIG. 2, includes the storage capacitor 140 and at least one of the first thin-film transistor 100 and the second thin-film transistor 150.

The gate-driving unit 182 is disposed in the non-display area NA. The gate-driving unit 182 is configured using the second thin-film transistor 150 including the polycrystalline semiconductor layer 154 shown in FIG. 2. At this time, the second thin-film transistor 150 of the gate-driving unit 182 is formed simultaneously with the first and second thin-film transistors 100 and 150 in the display area AA through the same process.

A multiplexer 186 may be disposed between the data-driving unit 184 and the data lines DL. The multiplexer 186 distributes data voltage from the data-driving unit 184 to the data lines DL in a temporally divided manner, thereby reducing the number of output channels of the data-driving unit 184 and consequently reducing the number of data driving integrated circuits that compose the data-driving unit 184. The multiplexer 186 is configured using the second thin-film transistor 150 including the polycrystalline semiconductor layer 154. At this time, the second thin-film transistor 150 of the multiplex 186 may be directly formed on a substrate 101 for a display device together with the second thin-film transistor 150 of the gate-driving unit 182 and the first and second thin-film transistors 100 and 150 in the display area AA.

Figure 2:
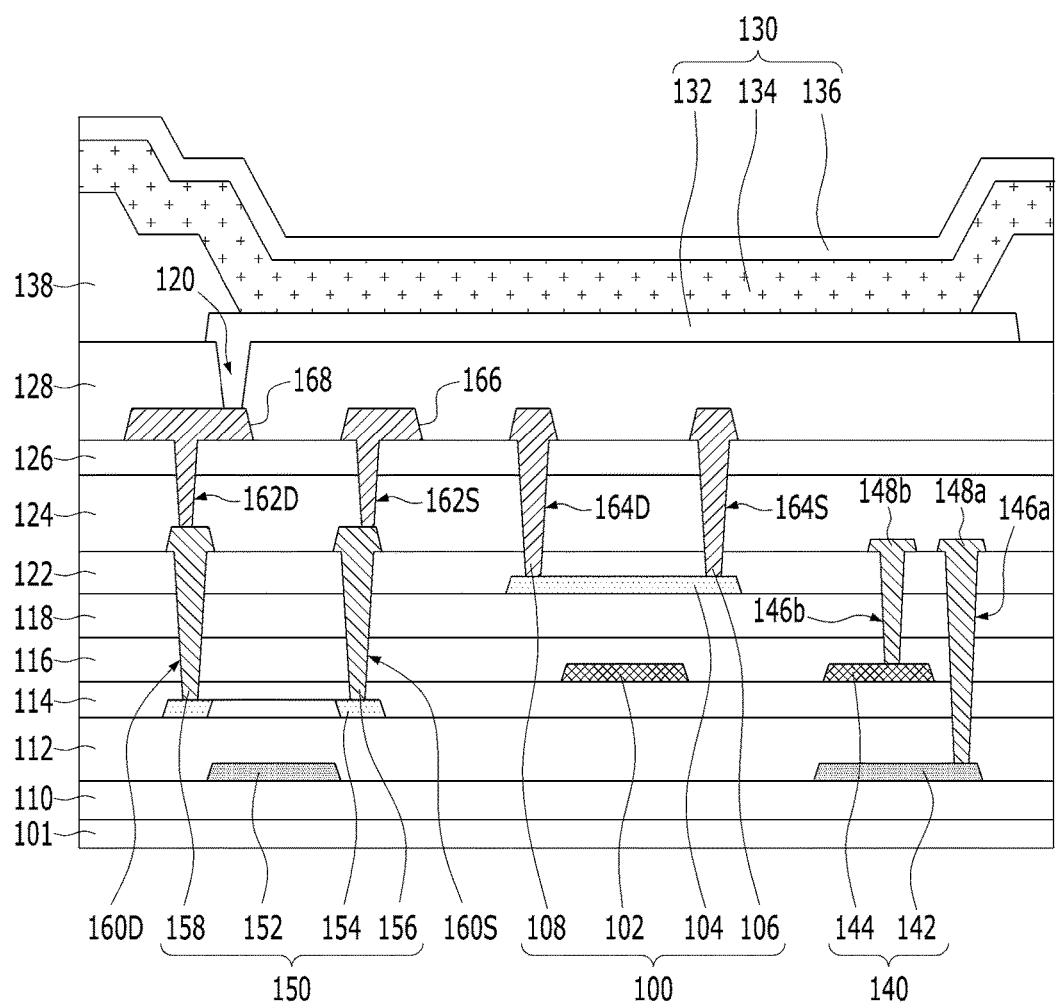
FIG. 2 is a sectional view illustrating an organic light-emitting display device according to an embodiment of the present disclosure.

The above-described display device is applicable to a display device that requires a thin-film transistor, e.g. the organic light-emitting display device shown in FIG. 2 or a liquid crystal display device.

The organic light-emitting display device shown in FIG. 2 includes first and second thin-film transistors 100 and 150, a light-emitting diode 130 electrically connected to the second thin-film transistor 150, and a storage capacitor 140.

Figure 3A:
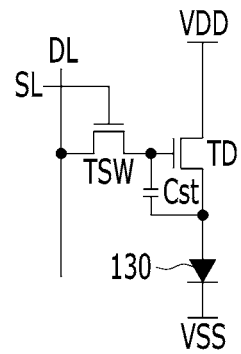
FIGS. 3A to 3C are circuit diagrams illustrating each sub-pixel of the organic light-emitting display device shown in FIG. 2 according to embodiments of the present disclosure.
Figure 3B:
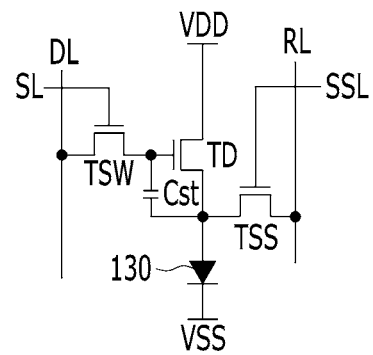
Figure 3C:
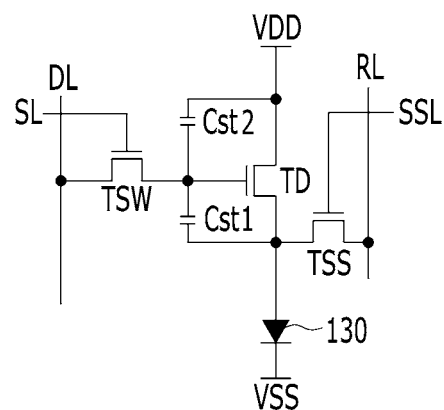

The first thin-film transistor 100 including an oxide semiconductor layer 104 is applied to switching and sensing transistors TSW and TSS of each pixel shown in FIGS. 3A to 3C, and the second thin-film transistor 150 including a polycrystalline semiconductor layer 154 is applied to a driving transistor TD of each pixel located in the display area AA. The switching transistor TSW serves to switch the data voltage input to each pixel located in the display area AA. The switching transistor TSW includes a gate electrode connected to a scan line SL, a source electrode connected to a data line DL, and a drain electrode connected to a gate electrode of the driving transistor TD. The driving transistor TD includes a gate electrode connected to the drain electrode of the switching transistor TSW, a source electrode connected to a high-voltage VDD supply line, and a drain electrode connected to a light-emitting diode 130. The sensing transistor TSS includes a gate electrode connected to a sensing control line SSL, a source electrode connected to a reference line RL, and a drain electrode connected to the light-emitting diode 130.

Alternatively, the first thin-film transistor 100 including the oxide semiconductor layer 104 may be applied to the switching transistor TSS and the driving transistor TD connected to each light-emitting diode 130. The second thin-film transistor 150 including the polycrystalline semiconductor layer 154 is applied to a transistor of a driving circuit of at least one of the gate-driving unit 182 located in the non-display area NA and the multiplexer 186.

The first thin-film transistor 100 includes a first gate electrode 102, an oxide semiconductor layer 104, a first source electrode 106, and a first drain electrode 108.

The first gate electrode 102, as shown in FIG. 2, is formed on a first interlayer insulation film 114, and overlaps the oxide semiconductor layer 104 with at least a first part of a second interlayer insulation film 116 and at least a first part of a third interlayer insulation film 118 interposed therebetween. Since the first gate electrode 102 is disposed under the oxide semiconductor layer 104, it is possible to prevent external light from being introduced into the oxide semiconductor layer 104. The first gate electrode 102 is disposed on the first interlayer insulation film 114, on which an upper storage electrode 144 is also disposed, and is formed of the same material as the upper storage electrode 144. Accordingly, the first gate electrode 102 and the upper storage electrode 144 may be formed through the same mask process, and therefore the number of mask processes may be reduced.

The oxide semiconductor layer 104 is formed on the third interlayer insulation film 118 so as to overlap the first gate electrode 102, thereby forming a channel between the first source electrode 106 and the first drain electrode 108. Thus, a bottom surface of the oxide semiconductor layer 104 may face the first gate electrode 102. The oxide semiconductor layer 104 is formed of oxide including at least one metal selected from among Zn, Cd, Ga, In, Sn, Hf, and Zr. Since the first thin-film transistor 100 including this oxide semiconductor layer 104 has advantages of higher electron mobility and lower off-current than the second thin-film transistor 150 including the polycrystalline semiconductor layer 154, it is suitable for application to the switching and sensing thin-film transistors TSW and TSS, in which an On-time period is short but an Off-time period is long.

The third and fourth interlayer insulation films 118 and 122, which are adjacent to the top and the bottom of the oxide semiconductor layer 104, are inorganic films that have lower hydrogen particle content than the first and second interlayer insulation films 114 and 116. For example, the third and fourth interlayer insulation films 118 and 122 are formed of silicon oxide (SiOx), and the first and second interlayer insulation films 114 and 116 are formed of silicon nitride (SiNx). Thus, the second interlayer insulation film 116 that contacts the first gate electrode 102 may be formed of silicon nitride (SiNx), and the third interlayer insulation film 118 that contacts the oxide semiconductor layer 104 may be formed of silicon oxide (SiOx). Accordingly, it is possible to prevent hydrogen contained in the third and fourth interlayer insulation films 118 and 122 and hydrogen contained in the polycrystalline semiconductor layer 154 from being diffused to the oxide semiconductor layer 104 during a heat treatment process performed on the oxide semiconductor layer 104.

Each of the first source electrode 106 and the first drain electrode 108 may be a single layer or multiple layers disposed on a second protective film 126 and formed of any one selected from among molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

The first source electrode 106 is connected to a source region of the oxide semiconductor layer 104 through a first source contact hole 164S that penetrates the fourth interlayer insulation film 122 and the first and second protective films 124 and 126. For example, the first source electrode 106 may contact a top surface of the oxide semiconductor layer 104. The first drain electrode 108 is connected to a drain region of the oxide semiconductor layer 104 through a first drain contact hole 164D that penetrates the fourth interlayer insulation film 122 and the first and second protective films 124 and 126. For example, the first drain electrode 108 may contact a top surface of the oxide semiconductor layer 104. The first source electrode 106 and the first drain electrode 108 are formed to face each other with the channel region of the oxide semiconductor layer 104 interposed therebetween. The first and second protective films 124 and 126 are formed on the oxide semiconductor layer 104 between the first source electrode 106 and the first drain electrode 108. The first and second protective films 124 and 126 protect the oxide semiconductor layer 104 positioned between the first source electrode 106 and the first drain electrode 108 from oxygen and moisture, thereby preventing damage to the oxide semiconductor layer 104. Although the embodiment has been described as having a construction in which the protective films 124 and 126 have a two-layer structure (refer to FIG. 2), the protective films 124 and 126 may alternatively be formed in a single-layer structure, which is formed of SiOx or SiNx.

The second thin-film transistor 150 is disposed on the substrate 101 so as to be spaced apart from the first thin-film transistor 100. The second thin-film transistor 150 includes a polycrystalline semiconductor layer 154, a second gate electrode 152, at least a first part of a gate insulating film 112, a second source electrode 156, and a second drain electrode 158.

The polycrystalline semiconductor layer 154 is formed on a gate insulation film 112 that covers the gate electrode 152. Thus, a bottom surface of the polycrystalline semiconductor layer 154 may face the second gate electrode 152. The polycrystalline semiconductor layer 154 includes a channel region, a source region and a drain region. The channel region overlaps the second gate electrode 102 with at least a first part of the gate insulation film 112 interposed therebetween, and forms a channel region between the second source electrode 156 and the second drain electrode 158. The source region is electrically connected to the second source electrode 156 through a second source contact hole 160S. The drain region is electrically connected to the second drain electrode 158 through a second drain contact hole 160D. The second source electrode 156 and the second drain electrode 158 may contact a top surface of the polycrystalline semiconductor layer 154. Since the polycrystalline semiconductor layer 154 has high mobility, low power consumption and high reliability, it is suitable for application to a driving transistor TD of each pixel, a gate-driving unit for driving gate lines, and/or a multiplexer (MUX).

The second gate electrode 152 is formed on a buffer layer 110 that covers the substrate 101. The second gate electrode 152 overlaps the channel region of the polycrystalline semiconductor layer 154 with the first gate insulation film 112 interposed therebetween. Since the second gate electrode 152 is disposed under the polycrystalline semiconductor layer 154, it is possible to prevent external light from being introduced into the polycrystalline semiconductor layer 154. The second gate electrode 152 may be a single layer or multiple layers formed of the same material as the first gate electrode 102, e.g. any one selected from among molybdenum (Mo), aluminum (Al), chrome (Cr), gold (Au), titanium (Ti), nickel (Ni), neodymium (Nd), and copper (Cu), or an alloy thereof. However, the embodiment is not limited thereto.

Figure 4A:
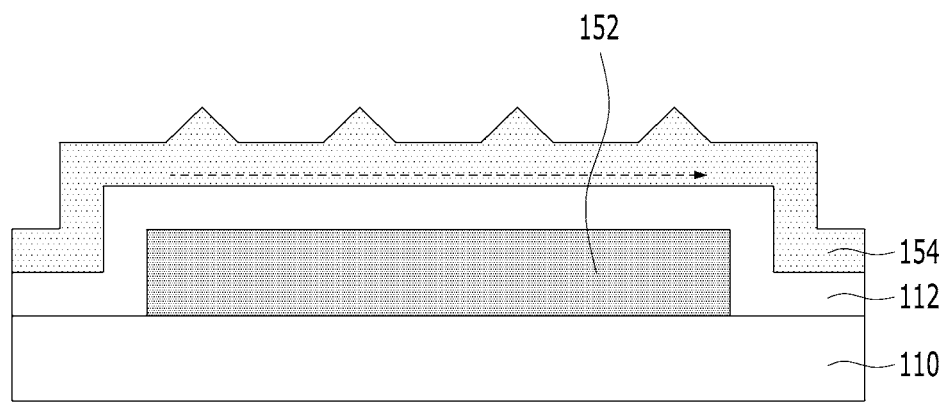
FIGS. 4A and 4B are sectional views illustrating a vertical relationship between a gate electrode and a polycrystalline semiconductor layer according to an embodiment of the present disclosure and a vertical relationship between a gate electrode and a polycrystalline semiconductor layer of a comparative example.
Figure 4B:
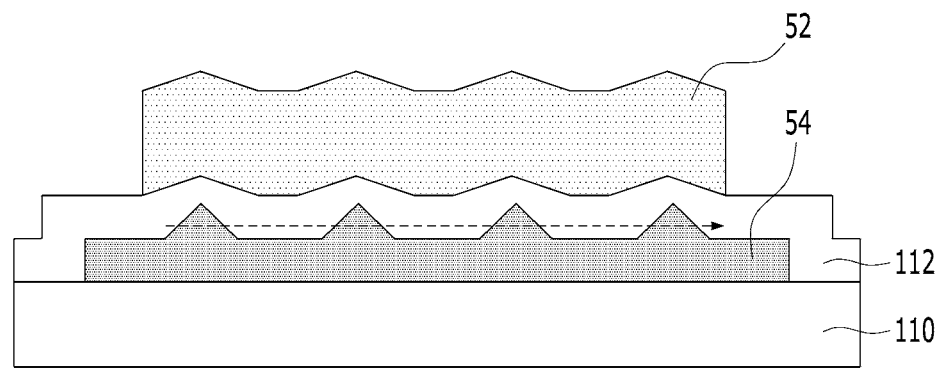

The second gate electrode 152 according to the embodiment of the present disclosure, as shown in FIG. 4A, is disposed under the polycrystalline semiconductor layer 154. In this case, reliability may be increased further than in the case of a comparative example, in which a gate electrode 52 is disposed above a polycrystalline semiconductor layer 54, as shown in FIG. 4B.

Specifically, the polycrystalline semiconductor layer is formed by crystallizing an amorphous silicon thin film through a laser-scanning process. In the crystallization process, protrusions are formed at the locations at which grains grown in the polycrystalline semiconductor meet each other. The polycrystalline semiconductor layer having these protrusions has a channel formed at the interface between a portion thereof that overlaps the gate electrode and the gate insulation film. The polycrystalline semiconductor layer 54 of the comparative example, as shown in FIG. 4B, is disposed under the gate electrode 52, but the polycrystalline semiconductor layer 154 of the present disclosure, as shown in FIG. 4A, is disposed above the second gate electrode 152. Therefore, as shown in FIG. 4B, because the top surface of the polycrystalline semiconductor layer 54 of the comparative example, which is in contact with the gate insulation film 112, is not flat due to a plurality of protrusions thereon, mobility and reliability are deteriorated. On the other hand, as shown in FIG. 4A, because the bottom surface of the polycrystalline semiconductor layer 154 of the embodiment, which is in contact with the gate insulation film 112, is flat, mobility and reliability are increased further than in the case of the comparative example.

The polycrystalline semiconductor layer 54 of the comparative example is subjected to a doping process using the gate electrode 52 as a mask. Accordingly, because each of the gate electrode 52 and the polycrystalline semiconductor layer 54 of the comparative example must be spaced apart from the gate lines, which are arranged in the same layer as the gate electrode 52, in the horizontal direction, a design margin of the channel region is inevitably increased, causing an increase in the size of the thin-film transistor and difficulty in realizing a narrow bezel. On the other hand, the polycrystalline semiconductor layer 154 of the present disclosure is subject to a doping process using a separate photoresist pattern as a mask. Accordingly, because each of the polycrystalline semiconductor layer 154 and the gate electrode 152 of the present invention is capable of overlapping the gate lines, a design margin of the channel region is decreased, realizing a reduction in the size of the second thin-film transistor 150 and facilitating the achievement of a narrow bezel. For example, a gate line on the substrate in a same layer as the second gate electrode 152 may overlap with the polycrystalline semiconductor layer 154 in a first direction.

Meanwhile, the first and second interlayer insulation films 114 and 116 positioned on the polycrystalline semiconductor layer 154 are inorganic films that have higher hydrogen particle content than the third and fourth interlayer insulation films 118 and 122. For example, the first and second interlayer insulation films 114 and 116 are formed of silicon nitride (SiNx), and the third and fourth interlayer insulation films 118 and 122 are formed of silicon oxide (SiOx). The hydrogen particles contained in the first and second interlayer insulation films 114 and 116 are diffused to the polycrystalline semiconductor layer 154 during a hydrogenation process, thereby enabling pores in the polycrystalline semiconductor layer 154 to be filled with hydrogen. Accordingly, the polycrystalline semiconductor layer 154 is stabilized, thus preventing deterioration of the properties of the second thin-film transistor 150.

The second source electrode 156 is connected to the source region of the polycrystalline semiconductor layer 154 through the second source contact hole 160S that penetrates the first to fourth interlayer insulation films 114, 116, 118 and 122. Thus, the second source electrode 156 may be disposed on a side surface of an opening in one or more of the first to fourth interlayer insulation films 114, 116, 118, and 122. The second drain electrode 158 faces the second source electrode 156, and is connected to the drain region of the polycrystalline semiconductor layer 154 through the second drain contact hole 160D that penetrates the first to fourth interlayer insulation films 114, 116, 118, and 122. Thus, the second drain electrode 158 may be disposed on a side surface of an opening in one or more of the first to fourth interlayer insulation films 114, 116, 118, and 122. Since the second source electrode 156 and the second drain electrode 158 are located in the same layer and are formed of the same material as the first and second storage supply lines 148a and 148b, the second source electrode 156 and the second drain electrode 158 may be formed simultaneously with the first and second storage supply lines 148a and 148b through the same mask process.

After the activation and hydrogenation processes of the polycrystalline semiconductor layer 154 of the second thin-film transistor 150, the oxide semiconductor layer 104 of the first thin-film transistor 100 is formed. That is, the oxide semiconductor layer 104 is disposed above the polycrystalline semiconductor layer 154. Accordingly, the oxide semiconductor layer 104 is not exposed to the high-temperature atmosphere of the activation and hydrogenation processes of the polycrystalline semiconductor layer 154, thereby preventing damage to the oxide semiconductor layer 104 and therefore improving reliability.

As shown in FIGS. 3A and 3B, one storage capacitor Cst may be provided in each sub-pixel, or, as shown in FIG. 3C, two or more storage capacitors may be provided in each sub-pixel. Each of the storage capacitors Cst shown in FIGS. 3A and 3B and the first storage capacitor Cst1 shown in FIG. 3C includes a lower storage electrode, which is connected to any one of the drain electrode of the switching transistor TSW and the drain electrode of the driving transistor TD, and an upper storage electrode, which is connected to the remaining one of the drain electrode of the switching transistor TSW and the drain electrode of the driving transistor TD. The second storage capacitor Cst2 shown in FIG. 3C includes a lower storage electrode, which is connected to any one of the drain electrode of the switching transistor TSW and the high-voltage VDD supply line, and an upper storage electrode, which is connected to the remaining one of the drain electrode of the switching transistor TSW and the high-voltage VDD supply line.

At least one storage capacitor 140 of the storage capacitors Cst, Cst1 and Cst2 shown in FIGS. 3A to 3C is formed in a manner such that, as shown in FIG. 2, the lower storage electrode 142 and the upper storage electrode 144 overlap each other with at least a second part of the gate insulation film 112 and at least a part of the first interlayer insulation film 114 interposed therebetween.

The lower storage electrode 142 is disposed on the buffer layer 110, and is located in the same layer and is formed of the same material as the second gate electrode 152. The lower storage electrode 142 is exposed through the first storage contact hole 146a that penetrates the gate insulation film 112 and the first to fourth interlayer insulation films 114, 116, 118, and 122, and is connected to the first storage supply line 148a. The lower storage electrode 142 is connected to any one of the drain electrode of the switching transistor TSW, the drain electrode of the driving transistor TD and the high-voltage VDD supply line through the first storage supply line 148a.

The upper storage electrode 144 is disposed on the first interlayer insulation film 114 that covers the polycrystalline semiconductor layer 154, and is located in the same layer and is formed of the same material as the first gate electrode 102. Specifically, the upper storage electrode 144 is disposed above the polycrystalline semiconductor layer 154 with the first interlayer insulation film 114 interposed therebetween. Accordingly, the upper storage electrode 144 and the first gate electrode 102 are formed through a mask process simultaneously with a doping process performed on the polycrystalline semiconductor layer 154.

The upper storage electrode 144 is exposed through the second storage contact hole 146b that penetrates the second to fourth interlayer insulation films 116, 118, and 122, and is connected to the second storage supply line 148b. The upper storage electrode 144 receives a driving voltage, which is different from the voltage supplied to the lower storage electrode 142, through the second storage supply line 148b. The upper storage electrode 144 is connected to any one of the drain electrode of the switching transistor TSW, the drain electrode of the driving transistor TD and the high-voltage VDD supply line through the second storage supply line 148b.

By forming the lower storage electrode 142 in the same layer and with the same material as the second gate electrode 152, and by forming the upper storage electrode 144 in the same layer and with the same material as the first gate electrode 102, the manufacturing process can further be simplified by reducing the number of mask processes compared to having a top-gate structure of the second thin-film transistor 150.

The gate insulation film 112 and the first interlayer insulation film 114, which are interposed between the lower storage electrode 142 and the upper storage electrode 144, are formed of an inorganic insulation material such as, for example, SiOx or SiNx. At least one of the gate insulation film 112 and the first interlayer insulation film 114 may be formed of SiNx, which has a higher dielectric constant than SiOx. Accordingly, since the upper storage electrode 144 overlaps the lower storage electrode 142, with the first interlayer insulation film 114, which is formed of SiNx having a relatively high dielectric constant, interposed therebetween, the capacity of the storage capacitor is increased in proportion to the dielectric constant.

The light-emitting diode 130 is a light-emitting device, and includes an anode 132, which is electrically connected to the second drain electrode 160 of the second thin-film transistor 150, at least one light-emitting stack 134, which is formed on the anode 132, and a cathode 136, which is formed on the light-emitting stack 134.

The anode 132 is connected to a drain connection electrode 168, which is exposed through a pixel contact hole 120 that penetrates a planarization layer 128. The drain connection electrode 168 is connected to the second drain electrode 158, which is exposed through a third drain contact hole 162D that penetrates the first and second protective films 124 and 126. A source connection electrode 166, which is located in the same layer as the drain connection electrode 168, is connected to the second source electrode 156, which is exposed through a third source contact hole 162S that penetrates the first and second protective films 124 and 126. The drain connection electrode 168 and the source connection electrode 166 are located in the same layer and are formed of the same material as a voltage supply line (not shown), which supplies one of a plurality of driving voltages to each pixel. For example, the voltage supply line is at least one of the high-voltage VDD supply line, the low-voltage VSS supply line, the data line DL, the scan line SL, the sensing control line SSL, and the reference line RL.

The anode 132 is formed in a multilayer structure including a transparent conductive film and an opaque conductive film having high reflection efficiency. The transparent conductive film is formed of a material having a relatively high work function, e.g. indium tin oxide (ITO) or indium zinc oxide (IZO), and the opaque conductive film is formed in a single-layer or multilayer structure including any one selected from among Al, Ag, Cu, Pb, Mo, and Ti or an alloy thereof. For example, the anode 132 may be formed in a structure such that a transparent conductive film, an opaque conductive film and a transparent conductive film are sequentially stacked, or such that a transparent conductive film and an opaque conductive film are sequentially stacked. The anode 132 is disposed on the planarization layer 128 so as to overlap a circuit area, in which the first and second transistors 100 and 150 and the storage capacitor 140 are disposed, as well as a light-emitting area defined by a bank 138, thereby increasing a light-emitting area.

The light-emitting stack 134 is formed by stacking, on the anode 132, a hole-related layer, an organic light-emitting layer, and an electron-related layer, either in that order or in the reverse order. In addition, the light-emitting stack 134 may include first and second light-emitting stacks, which are opposite each other with a charge generation layer interposed therebetween. In this case, an organic light-emitting layer of any one of the first and second light-emitting stacks generates blue light, and an organic light-emitting layer of the remaining one of the first and second light-emitting stacks generates yellow-green light, with the result that white light is generated via the first and second light-emitting stacks. The white light generated by the light-emitting stack 134 is introduced into a color filter (not shown) disposed on the light-emitting stack 134, and consequently a color image is realized. Alternatively, it may be possible to realize a color image in a way such that each light-emitting stack 134 generates colored light corresponding to each sub-pixel without a separate color filter. That is, a light-emitting stack 134 of a red (R) sub-pixel may generate red light, a light-emitting stack 134 of a green (G) sub-pixel may generate green light, and a light-emitting stack 134 of a blue (B) sub-pixel may generate blue light.

The bank 138 is formed so as to expose the anode 132. The bank 138 may be formed of an opaque material (e.g. a black material) in order to prevent optical interference between neighboring sub-pixels. In this case, the bank 138 includes a light-shielding material including at least one selected from among a color pigment, organic black and carbon materials.

The cathode 136 is formed on the upper surface and the side surface of the light-emitting stack 134 so as to be opposite the anode 132 with the light-emitting stack 134 interposed therebetween. In the case in which the cathode 136 is applied to a top-emission-type organic light-emitting display device, the cathode 136 is configured as a transparent conductive film formed of, for example, indium tin oxide (ITO) or indium zinc oxide (IZO).

As described above, according to the present disclosure, the first thin-film transistor 100 including the oxide semiconductor layer 104 is applied to a switching transistor TSW of each sub-pixel. The first thin-film transistor 100 including the oxide semiconductor layer 104 has lower off-current than the second thin-film transistor 150 including the polycrystalline semiconductor layer 154. Accordingly, the present disclosure may operate in a low-speed driving mode to lower a frame frequency for a still image or an image having a slow data update interval, thereby reducing power consumption. In addition, the oxide semiconductor layer 104 of the first thin-film transistor 100 has excellent saturation characteristics and therefore facilitates low-voltage operation.

Further, according to the present disclosure, the second thin-film transistor 150 including the polycrystalline semiconductor layer 154 is applied to a driving transistor TD of each sub-pixel and a driving element of a driving circuit. Since the polycrystalline semiconductor layer 154 has higher mobility (100 $cm^2/Vs$ or more), lower power consumption and higher reliability than the oxide semiconductor layer 104, it is capable of being applied to the gate-driving unit 182 and/or the multiplexer (MUX) 186.

FIGS. 5A to 5K are sectional views for explaining a method of manufacturing the organic light-emitting display device shown in FIG. 2 according to an embodiment of the present disclosure.

Figure 5A:
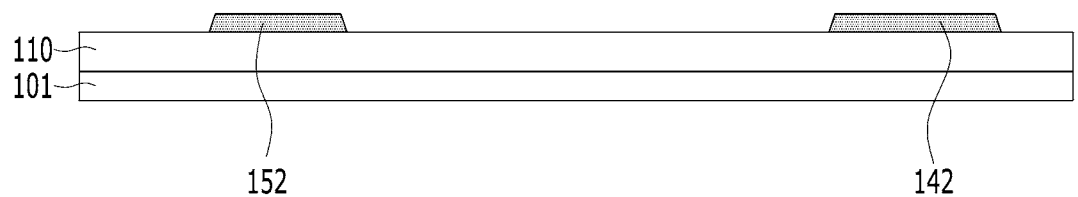
FIGS. 5A to 5K are sectional views for explaining a method of manufacturing the organic light-emitting display device shown in FIG. 2 according to an embodiment of the present disclosure.

Referring to FIG. 5A, the buffer layer 110 is formed on the substrate 101, and the second gate electrode 152 and the lower storage electrode 142 are formed on the buffer layer 110.

Specifically, an inorganic insulation material, such as SiOx or SiNx, is deposited on the entire surface of the substrate 101, thereby forming the buffer layer 110 having a single-layer or multilayer structure. Subsequently, the second gate electrode 152 and the lower storage electrode 142 are formed by depositing a first conductive layer on the entire surface of the substrate 101, on which the buffer layer 110 has been formed, and patterning the first conductive layer through a photolithography process using a first mask and an etching process.

Figure 5B:
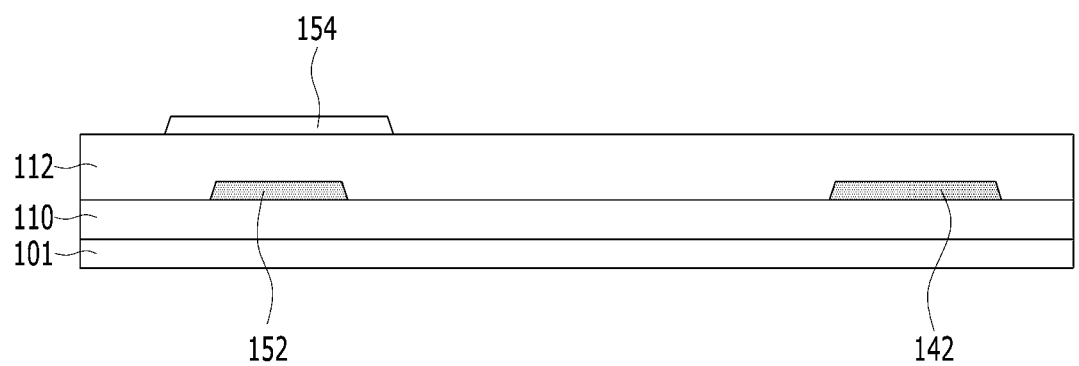

Referring to FIG. 5B, the first gate insulation film 112 is formed on the substrate 101, on which the second gate electrode 152 and the lower storage electrode 142 have been formed, and the polycrystalline semiconductor layer 154 is formed on the first gate insulation film 112. Thus, the first gate insulation film 112 includes at least a first part overlapping with the second gate electrode 152 and at least a second part overlapping with the lower storage electrode 142.

Specifically, the gate insulation film 112 is formed by depositing an inorganic insulation material, such as SiNx or SiOx, on the entire surface of the substrate 101 on which the second gate electrode 152 and the lower storage electrode 142 have been formed. Subsequently, an amorphous silicon thin film is formed on the gate insulation film 112 using a low-pressure chemical vapor deposition (LPCVD) or plasma-enhanced chemical vapor deposition (PECVD) method. Subsequently, a polycrystalline silicon thin film is formed by crystallizing the amorphous silicon thin film. Subsequently, the polycrystalline semiconductor layer 154 is formed by patterning the polycrystalline silicon thin film through a photolithography process using a second mask and an etching process.

Figure 5C:
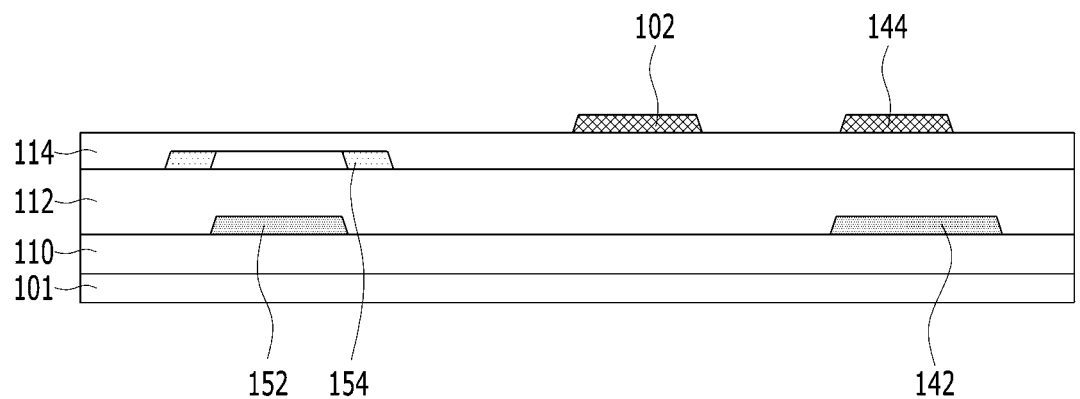

Referring to FIG. 5C, the first interlayer insulation film 114 is formed on the substrate 101, on which the polycrystalline semiconductor layer 154 has been formed, the first gate electrode 102 and the upper storage electrode 144 are formed on the first interlayer insulation film 114, and the source, channel, and drain regions of the polycrystalline semiconductor layer 154 are formed. This will now be described in detail with reference to FIGS. 6A to 6D.

Figure 6A:
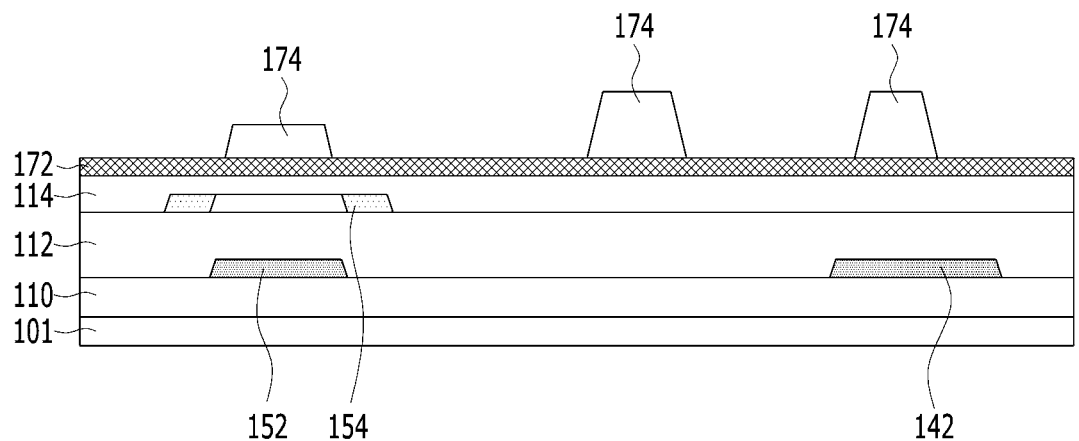
FIGS. 6A to 6D are sectional views for explaining a doping process performed through a single mask process and a method of manufacturing an upper storage electrode according to an embodiment of the present disclosure.
Figure 6B:
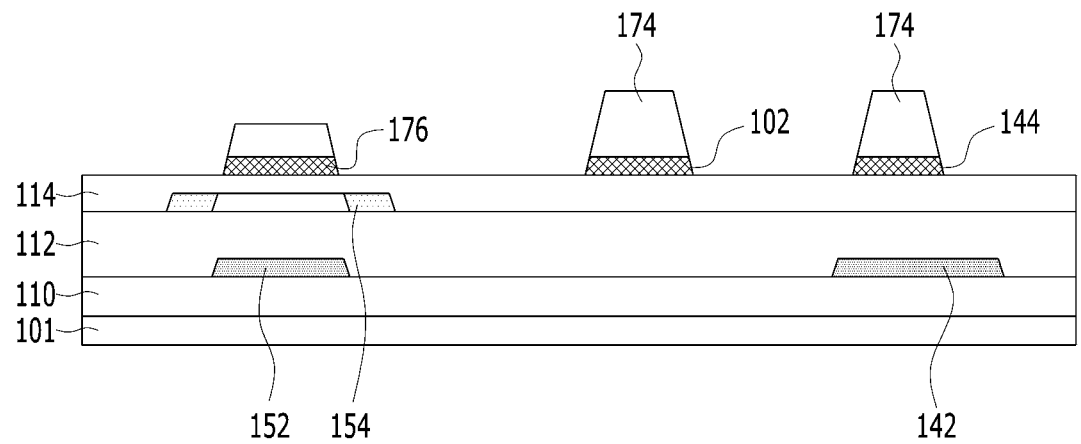
Figure 6C:
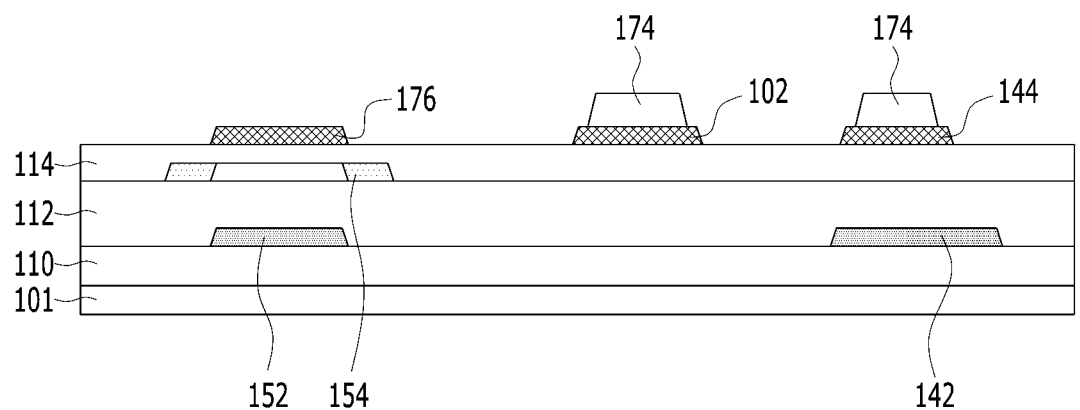
Figure 6D:
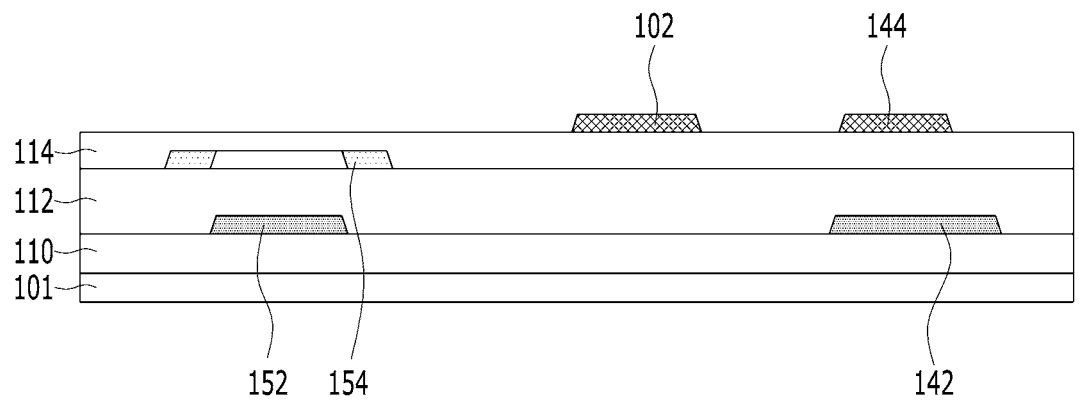

As shown in FIG. 6A, an inorganic insulation material, such as SiNx or SiOx, is deposited on the entire surface of the substrate 101, on which the polycrystalline semiconductor layer 154 has been formed, thereby forming the first interlayer insulation film 114. After a second conductive layer 172 is deposited on the entire surface of the first interlayer insulation film 114, a photoresist pattern 174 having a multi-layer structure is formed on the second conductive layer 172 through a photolithography process using a third mask. The photoresist pattern 174 having a multi-layer structure is formed on the region, on which the first gate electrode 102 and the upper storage electrode 144 are to be formed, to a first thickness, and is formed on the region that overlaps the second gate electrode 152 to a second thickness, which is less than the first thickness. The second conductive layer 172 is patterned through an etching process using the photoresist pattern 174 having a multi-layer structure as a mask. Accordingly, as shown in FIG. 6B, the first gate electrode 102 and the upper storage electrode 144, which correspond to the portion of the photoresist pattern 174 that has the first thickness, are formed, and a sacrificial layer 176, which corresponds to the portion of the photoresist pattern 174 that has the second thickness, is formed. Subsequently, the polycrystalline semiconductor layer 154 is doped with impurities through a doping process using the sacrificial layer 176 and the portion of the photoresist pattern 174 that has the second thickness as a mask, thereby forming source and drain regions, which do not overlap the sacrificial layer 176, and a channel region, which overlaps the sacrificial layer 176. Subsequently, as shown in FIG. 6C, through an ashing process performed on the photoresist pattern 174 having a multi-layer structure, the portion of the photoresist pattern 174 that has the first thickness is made thinner, and the portion of the photoresist pattern 174 that has the second thickness is removed, thereby enabling the sacrificial layer 176 to be selectively exposed. Subsequently, the exposed sacrificial layer 176 is removed through a second etching process, and, as shown in FIG. 6D, the photoresist pattern 174, which remains on the substrate 101, is removed through a stripping process.

Figure 5D:
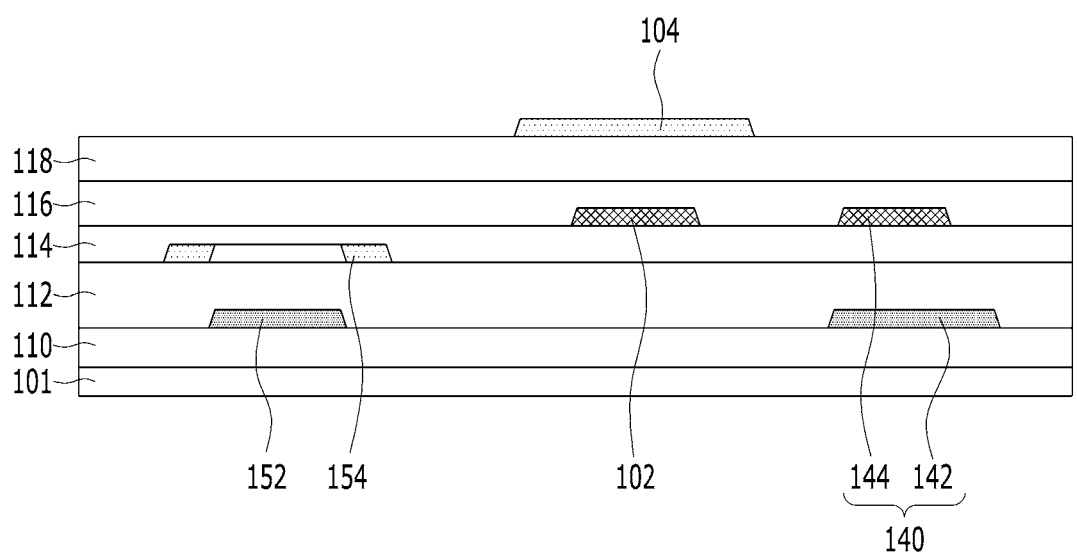

Referring to FIG. 5D, the second and third interlayer insulation films 116 and 118 and the oxide semiconductor layer 104 are sequentially formed on the substrate 101, on which the first gate electrode 102 and the upper storage electrode 144 have been formed.

Specifically, the second and third interlayer insulation films 116 and 118 are sequentially formed by depositing an inorganic insulation material, such as SiOx or SiNx, on the entire surface of the substrate 101, on which the first gate electrode 102 and the upper storage electrode 144 have been formed. Subsequently, the oxide semiconductor layer 104 is deposited on the entire surface of the third interlayer insulation film and is then patterned through a photolithography process using a fourth mask and an etching process, thereby forming the oxide semiconductor layer 104 such that it overlaps the first gate electrode 102.

Figure 5E:
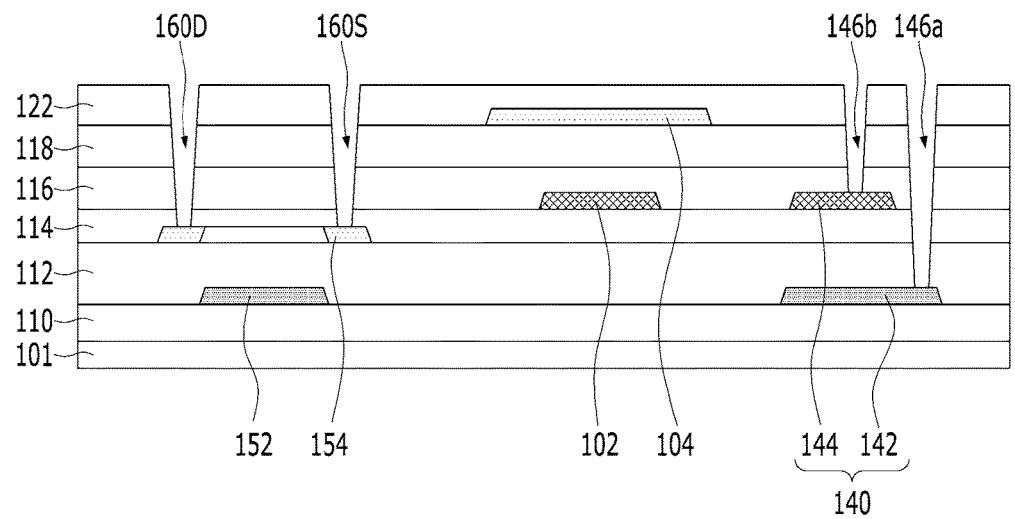

Referring to FIG. 5E, the fourth interlayer insulation film 122 is formed on the substrate 101, on which the oxide semiconductor layer 104 has been formed, and the first and second storage contact holes 146a and 146b, the second source contact hole 160S and the second drain contact hole 160D are formed.

Specifically, an inorganic insulation material, such as SiOx or SiNx, is deposited on the entire surface of the substrate 101, on which the oxide semiconductor layer 104 has been formed, thereby forming the fourth interlayer insulation film 122. Subsequently, the gate insulation film 112 and the first to fourth interlayer insulation films 114, 116, 118, and 122 are selectively patterned through a photolithography process using a fifth mask and an etching process, thereby forming the first and second storage contact holes 146a and 146b, the second source contact hole 160S and the second drain contact hole 160D. The first interlayer insulation film 114 includes at least a part overlapping with the lower storage electrode 142. The second source and second drain contact holes 160S and 160D penetrate the first to fourth interlayer insulation films 114, 116, 118, and 122 so as to expose the polycrystalline semiconductor layer 154. The first storage contact hole 146a penetrates the gate insulation film 112 and the first to fourth interlayer insulation films 114, 116, 118, and 122 so as to expose the lower storage electrode 142. The second storage contact hole 146b penetrates the second to fourth interlayer insulation films 116, 118, and 122 so as to expose the upper storage electrode 144.

Figure 5F:
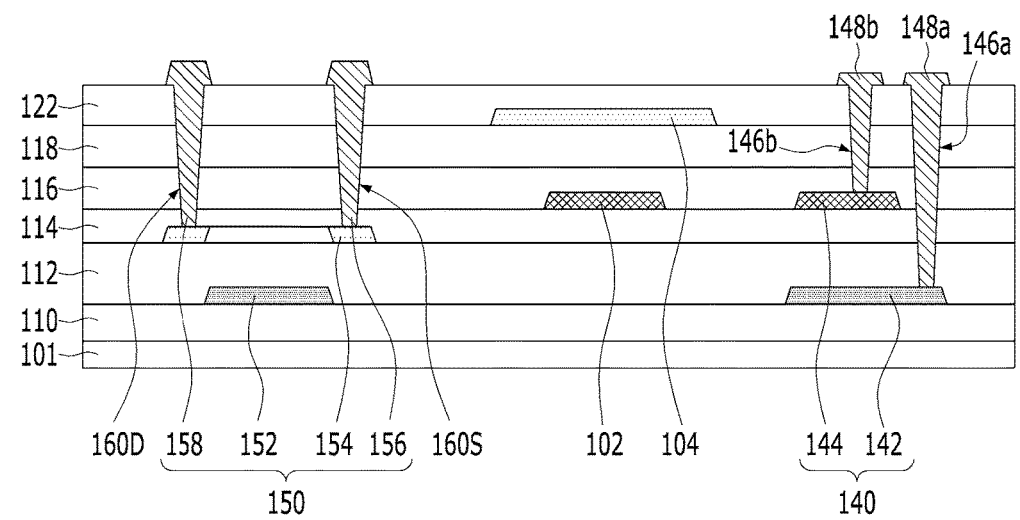

Referring to FIG. 5F, the first and second storage supply lines 148a and 148b and the second source and second drain electrodes 156 and 158 are formed on the substrate 101, on which the first and second storage contact holes 146a and 146b and the second source and second drain contact holes 160S and 160D have been formed.

Specifically, a third conductive layer is deposited on the entire surface of the substrate 101, on which the first and second storage contact holes 146a and 146b and the second source and second drain contact holes 160S and 160D have been formed. Subsequently, the third conductive layer is patterned through a photolithography process using a sixth mask and an etching process, thereby forming the first and second storage supply lines 148a and 148b and the second source and second drain electrodes 156 and 158.

Figure 5G:
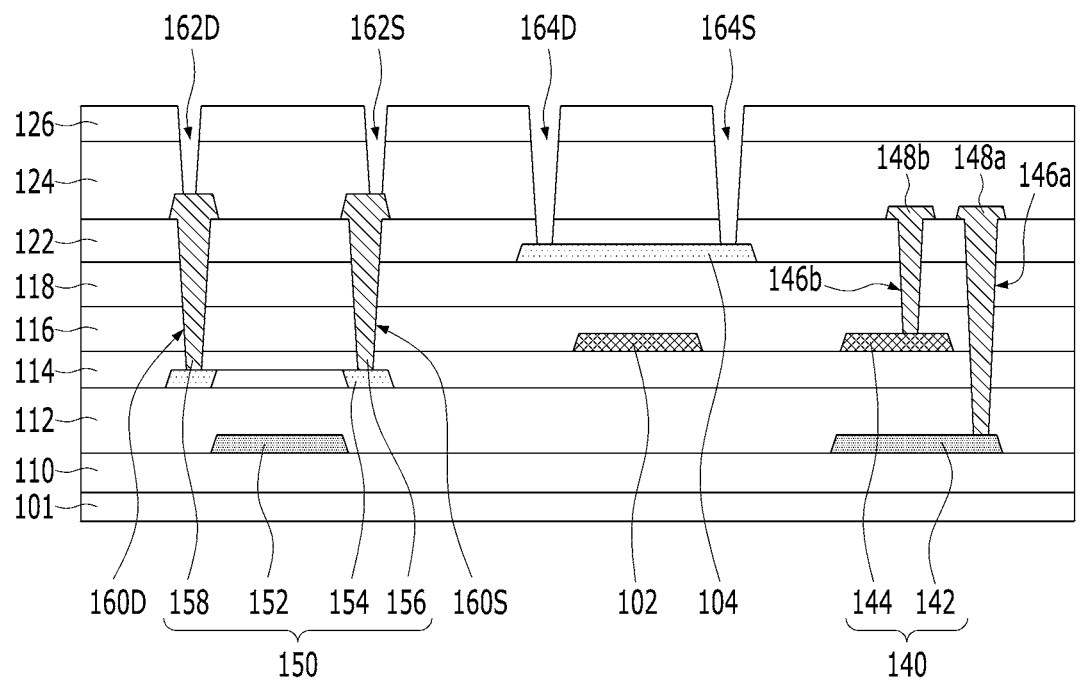

Referring to FIG. 5G, the first and second protective films 124 and 126 having therein the first source and first drain contact holes 164S and 164D and the third source and third drain contact holes 162S and 162D are formed on the substrate 101, on which the first and second storage supply lines 148a and 148b and the second source and second drain electrodes 156 and 158 have been formed.

Specifically, an inorganic insulation material, such as SiOx or SiNx, is deposited at least two times on the entire surface of the substrate 101, on which the first and second storage supply lines 148a and 148b and the second source and second drain electrodes 156 and 158 have been formed, thereby forming the first and second protective films 124 and 126. Subsequently, the fourth interlayer insulation film 122 and the first and second protective films 124 and 126 are selectively patterned through a photolithography process using a seventh mask and an etching process, thereby forming the first source and first drain contact holes 164S and 164D and the third source and third drain contact holes 162S and 162D. Each of the first source and first drain contact holes 164S and 164D penetrates the fourth interlayer insulation film 122 and the first and second protective films 124 and 126 so as to expose the oxide semiconductor layer 104. The third source and third drain contact holes 162S and 162D penetrate the first and second protective films 124 and 126 so as to expose the second source and second drain electrodes 156 and 158.

Figure 5H:
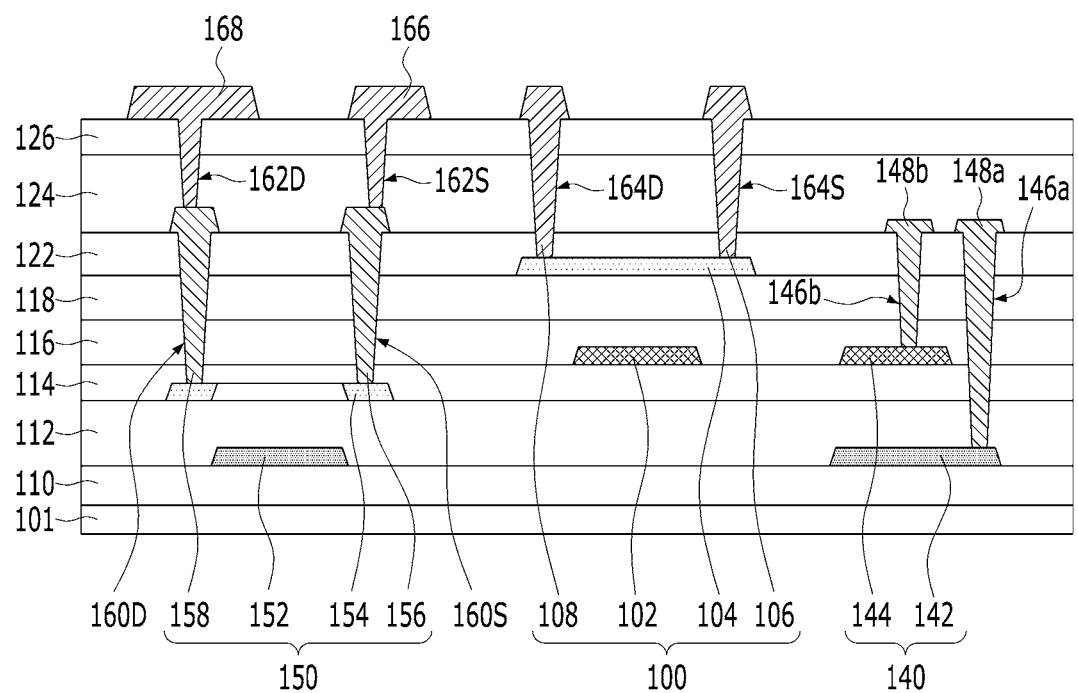

Referring to FIG. 5H, the first source and first drain electrodes 106 and 108 and the source and drain connection electrodes 166 and 168 are formed on the substrate 101, in which the first source and first drain contact holes 164S and 164D and the third source and third drain contact holes 162S and 162D have been formed.

Specifically, a fourth conductive layer is deposited on the entire surface of the substrate 101, in which the first source and first drain contact holes 164S and 164D and the third source and third drain contact holes 162S and 162D have been formed. Subsequently, the fourth conductive layer is patterned through a photolithography process using an eighth mask and an etching process, thereby forming the first source and first drain electrodes 106 and 108 and the source and drain connection electrodes 166 and 168.

Figure 5I:
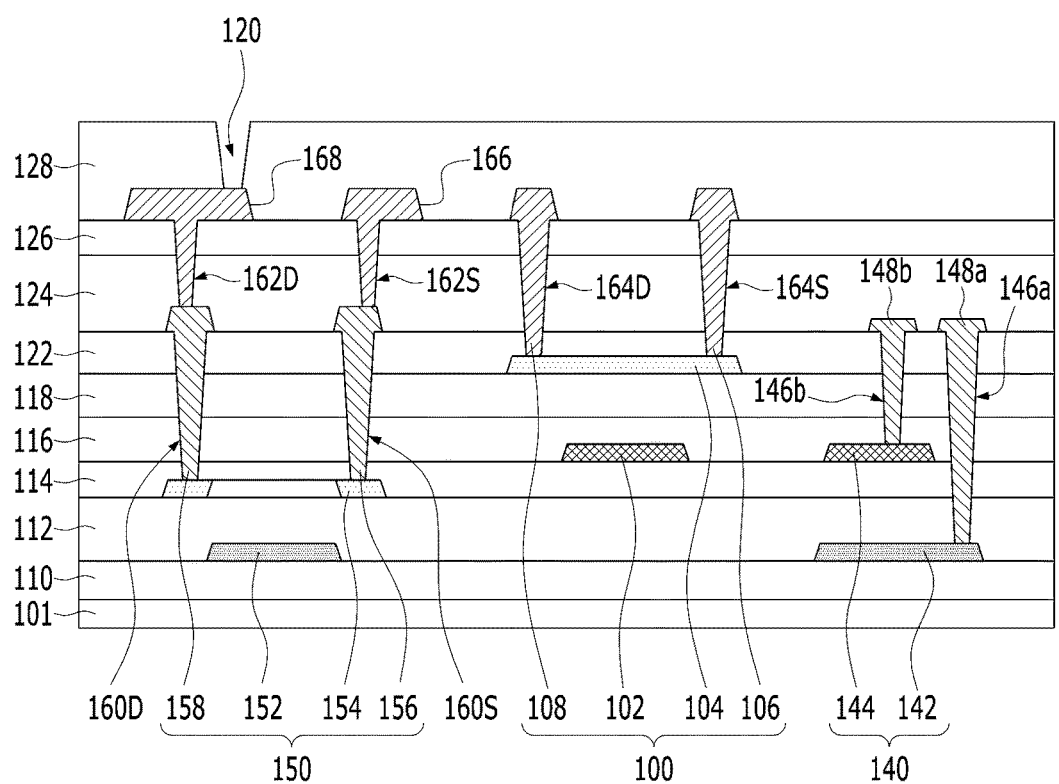

Referring to FIG. 5I, the planarization layer 128 having the pixel contact hole 120 formed therein is formed on the substrate 101, on which the first source and first drain electrodes 106 and 108 and the source and drain connection electrodes 166 and 168 have been formed.

Specifically, an organic insulation material such as an acrylic resin is deposited on the entire surface of the substrate 101, on which the first source and first drain electrodes 106 and 108 and the source and drain connection electrodes 166 and 168 have been formed, thereby forming the planarization layer 128. Subsequently, the planarization layer 128 is patterned through a photolithography process using a ninth mask, thereby forming the pixel contact hole 120.

Figure 5J:
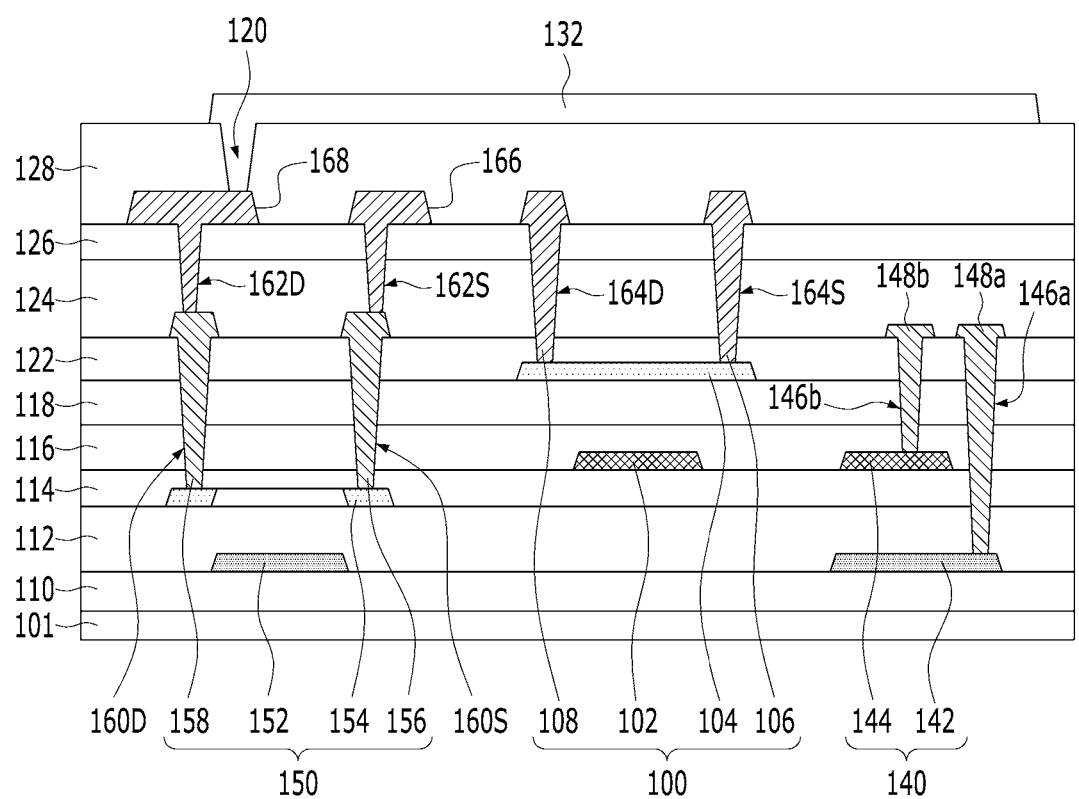

Referring to FIG. 5J, the anode 132 is formed on the substrate 101, on which the planarization layer 128 having the pixel contact hole 120 formed therein has been formed.

Specifically, a fifth conductive layer is deposited on the entire surface of the substrate 101, on which the planarization layer 128 having the pixel contact hole 120 formed therein has been formed. The fifth conductive layer may include a transparent conductive film and an opaque conductive film. Subsequently, the fifth conductive layer is patterned through a photolithography process and an etching process, thereby forming the anode 132.

Figure 5K:
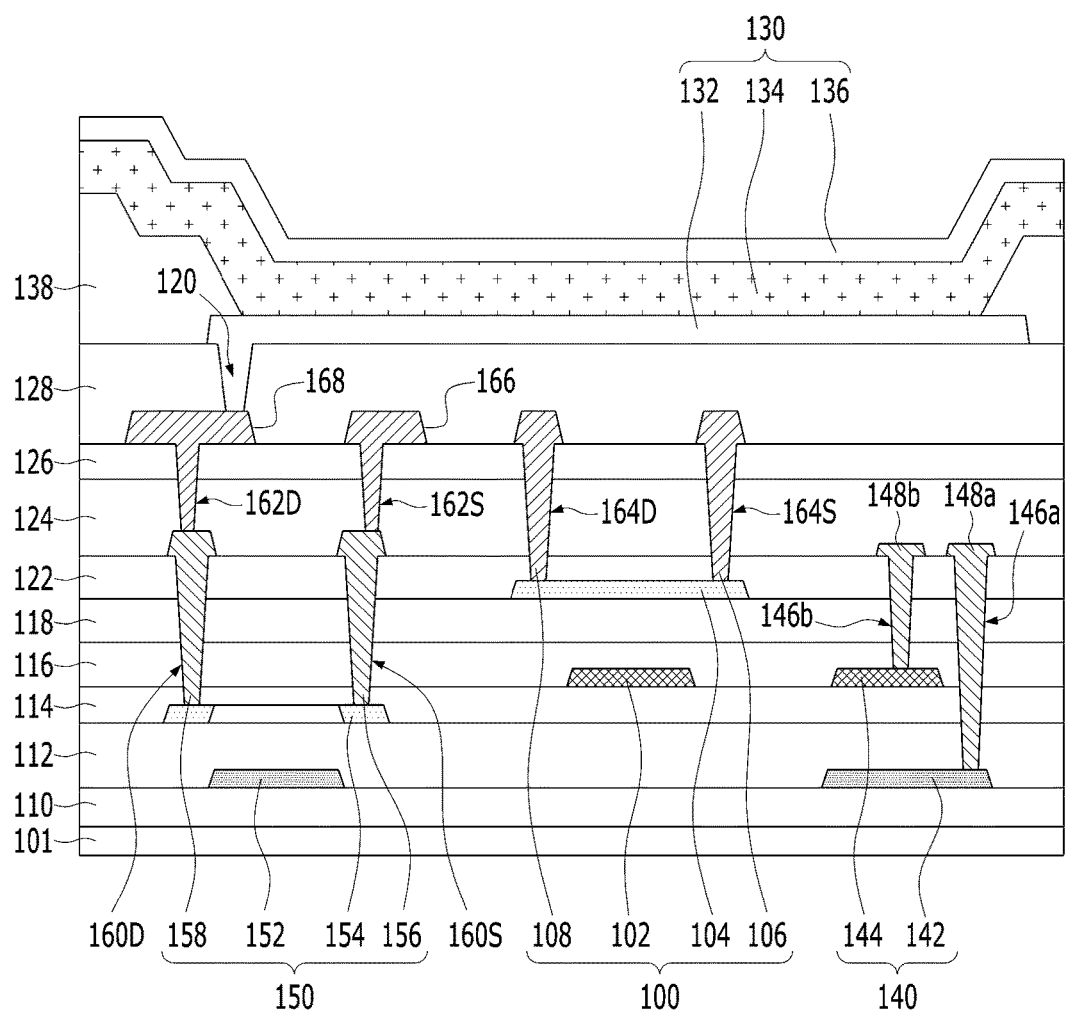

Referring to FIG. 5K, the bank 138, the organic light-emitting stack 134 and the cathode 136 are sequentially formed on the substrate 101, on which the anode 132 has been formed.

Specifically, a photosensitive film is coated on the entire surface of the substrate 101, on which the anode 132 has been formed, and is patterned through a photolithography process, thereby forming the bank 138. Subsequently, the light-emitting stack 134 and the cathode 136 are sequentially formed in the display area AA, but not the non-display area NA, through a deposition process using a shadow mask.

As described above, according to the present disclosure, the process of forming the upper storage electrode 144 and the first gate electrode 102 and the doping process performed on the polycrystalline semiconductor layer 154 are performed through the same single mask process. Accordingly, the organic light-emitting display device according to the present disclosure may obviate one or more mask processes, as compared to the prior art, thereby simplifying the structure and the manufacturing process thereof and improving productivity.

Figure 7A:
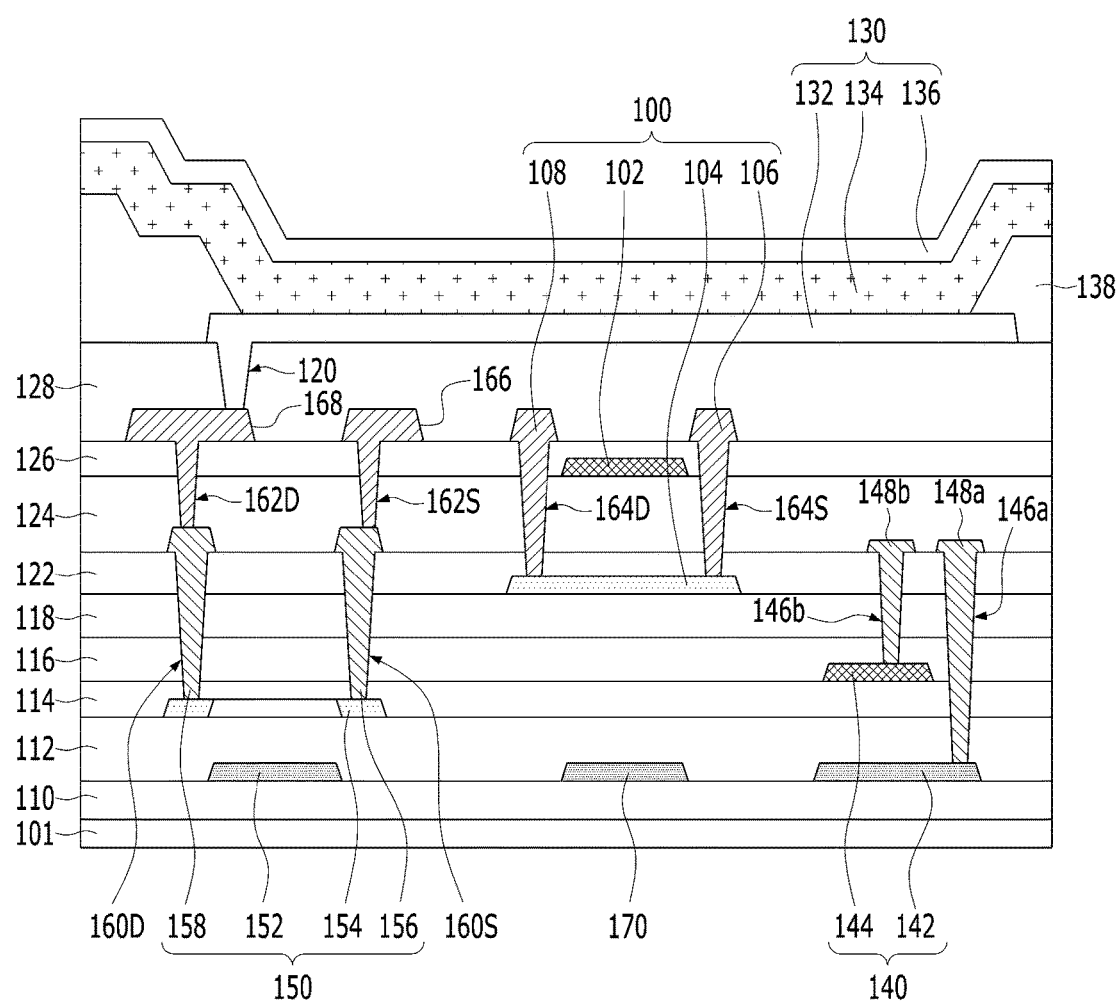
FIGS. 7A and 7B are sectional views illustrating other embodiments of the organic light-emitting display device shown in FIG. 2.
Figure 7B:
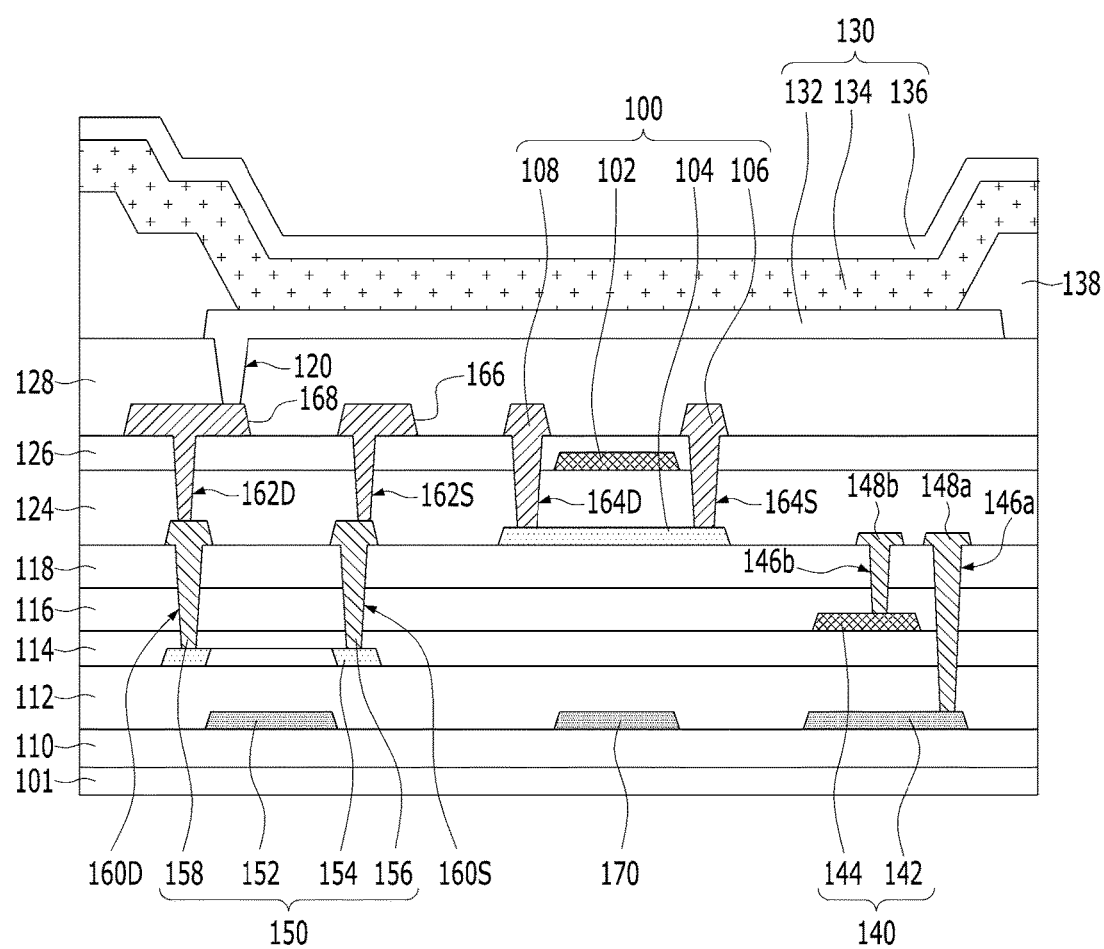

Meanwhile, although an embodiment has been described with reference to the construction in which the first thin-film transistor 100 including the oxide semiconductor layer 104 has a bottom-gate structure, the first thin-film transistor 100 including the oxide semiconductor layer 104 may be formed in a top-gate structure, as shown in FIGS. 7A and 7B. That is, the gate electrode 102 of the first thin-film transistor shown in FIG. 7A is disposed on any one of the first and second protective films 124 and 126 so as to be positioned above the oxide semiconductor layer 104, which is protected by the fourth interlayer insulation film 122. In this case, the oxide semiconductor layer 104 is disposed on the third interlayer insulation film 118, which is positioned between the second source and second drain electrodes 156 and 158 and the polycrystalline semiconductor layer 154. The gate electrode 102 of the thin-film transistor shown in FIG. 7B is disposed on the first protective film 124 so as to be positioned above the oxide semiconductor layer 104, which is protected by the first protective film 124. That is, since the oxide semiconductor layer 104 is disposed in the same layer as the second source and second drain electrodes 156 and 158, the fourth interlayer insulation film 122 shown in FIG. 7A may be omitted. As shown in FIGS. 7A and 7B, a bottom surface of the first gate electrode 102 may face the oxide semiconductor layer 104, and the first source electrode 106 and the first drain electrode 108 may contact a top surface of the oxide semiconductor layer 104.

In order to prevent external light from being introduced into the oxide semiconductor layer 104 shown in FIGS. 7A and 7B, a light-shielding layer 170 is formed on the buffer layer 110. Since the light-shielding layer 170 is formed simultaneously with the second gate electrode 152 and the lower storage electrode 142 through the same single mask process, an additional mask process for forming the light-shielding layer 170 is unnecessary.

As is apparent from the above description, the present invention may achieve lower power consumption and low-voltage operation by applying a thin-film transistor including an oxide semiconductor layer to a thin-film transistor positioned in a display area. In addition, the present disclosure may reduce the number of driving integrated circuits and reduce a bezel area by applying a thin-film transistor including a polycrystalline semiconductor layer to a gate-driving unit positioned in a non-display area and a multiplexer. In addition, according to the present disclosure, one of at least two storage electrodes is formed simultaneously with a gate electrode, which is disposed under the polycrystalline semiconductor layer, through the same single mask process, and another one of the at least two storage electrodes is formed through a mask process simultaneously with a doping process performed on the polycrystalline semiconductor layer. Accordingly, an organic light-emitting display device according to the present disclosure is capable of reducing one or more mask processes, as compared to the prior art, thereby simplifying the structure and the manufacturing process thereof and improving productivity. In addition, according to the present disclosure, since the gate electrode is disposed under the polycrystalline semiconductor layer, both design freedom and reliability are increased.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device, comprising:
   a substrate;
   a pixel on the substrate, the pixel including:
   a first TFT on the substrate, the first TFT including:
   a first active layer formed of oxide semiconductor; and
   a second thin film transistor (TFT) on the substrate, the second TFT including:
   a gate electrode on the substrate,
   at least a first part of a gate insulating film on the gate electrode,
   a second active layer formed of polycrystalline silicon on the first part of the gate insulating film, wherein a bottom surface of the second active layer faces the gate electrode, and
   a source electrode and a drain electrode contacting a top surface of the second active layer;
   a light-emitting device electrically connected to the second TFT; and
   a connection electrode contacting both of the drain electrode of the second TFT and an anode electrode of the light-emitting device between the drain electrode of the second TFT and the anode electrode.

2. The display device of claim 1, wherein the light-emitting device comprises an anode electrode, a light-emitting stack, and a cathode electrode, wherein the display device further comprises a bank layer on at least a part of the anode electrode, and wherein the bank layer includes a light-shielding material selected from at least one among a color pigment, and organic black and carbon materials.

3. The display device of claim 1, wherein the first TFT further includes:
   another gate electrode disposed below the first active layer, wherein a bottom surface of the first active layer faces the another gate electrode, and another source electrode and another drain electrode contacting a top surface of the first active layer.

4. The display device of claim 1, wherein the light-emitting device comprises the anode electrode, a light-emitting stack, and a cathode electrode, wherein the connection electrode is electrically connected to the drain electrode of the second TFT and the anode electrode.

5. The display device of claim 1, wherein the first TFT is a sensing TFT of the pixel, and the first TFT further includes another drain electrode electrically connected to the light-emitting device, and another source electrode connected to a reference line on the substrate.

6. The display device of claim 1, wherein the first TFT is a switching TFT of the pixel, and the first TFT further includes another drain electrode electrically connected to the gate electrode, and another source electrode connected to a data line on the substrate.

7. The display device of claim 1, further comprising a data-driving unit and a multiplexer that drives a plurality of data lines on the substrate, and wherein the multiplexer includes a third TFT including a third active layer formed of polycrystalline silicon.

8. The display device of claim 1, wherein the light-emitting device comprises an anode electrode, a light-emitting stack, and a cathode electrode, and wherein the anode electrode includes a transparent conductive film and an opaque conductive film.

9. The display device of claim 1, further comprising a gate-driving unit that drives a plurality of gate lines on the substrate, and wherein the gate-driving unit includes a third TFT including a third active layer formed of polycrystalline silicon.

10. The display device of claim 1, wherein the light-emitting device comprises an anode electrode, a light-emitting stack, and a cathode electrode, wherein the anode electrode overlaps with the first TFT and the second TFT.

11. The display device of claim 1, wherein the light-emitting device is electrically connected to the second TFT, and wherein the second TFT is a driving TFT that drives the light-emitting device.

12. The display device of claim 1, further comprising a gate line on the substrate in a same layer as the gate electrode, wherein the gate line overlaps with the second active layer.

13. The display device of claim 1, wherein the first TFT further includes:
    another gate electrode on the first active layer, wherein a bottom surface of the another gate electrode faces the first active layer, and
    another source electrode and another drain electrode contacting a top surface of the first active layer.

14. The display device of claim 13, further comprising a light shielding layer on the substrate overlapping with the first active layer, wherein the light-shielding layer is in a same layer as the gate electrode of the second TFT.

15. The display device of claim 1, further comprising another connection electrode contacting the source electrode of the second TFT between the source electrode of the second TFT and the anode electrode.

16. The display device of claim 15, wherein the connection electrode and the another connection electrode are overlapping with the anode.

17. The display device of claim 1, further comprising a storage electrode on the substrate, the storage electrode including a lower storage electrode and an upper storage electrode disposed on the lower storage electrode.

18. The display device of claim 17, further comprising a first interlayer insulation film on the second active layer contacting the second active layer, wherein the storage capacitor further includes at least a first part of the first interlayer insulation film and at least a second part of the gate insulating film disposed between the lower storage electrode and the upper storage electrode.

19. The display device of claim 17, wherein the first TFT further includes another gate electrode, and wherein the upper storage electrode is in a same layer as the another gate electrode.

20. The display device of claim 17, wherein the lower storage electrode is in a same layer as the gate electrode of the second TFT.

21. The display device of claim 1, further comprising a first interlayer insulation film on the second active layer contacting the second active layer, and wherein the first active layer is disposed on the first interlayer insulation film.

22. The display device of claim 21, wherein the first interlayer insulation film is formed of silicon nitride (SiNx).

23. The display device of claim 21, wherein the first TFT further includes:
    another gate electrode disposed on the first interlayer insulation film, and
    at least a first part of a second interlayer insulation film between the another gate electrode and the first active layer.

24. The light-emitting display device of claim 23, wherein the first TFT further includes at least a first part of a third interlayer insulation film between the another gate electrode and the first active layer, wherein the third interlayer insulation film contacts the first active layer and is formed of silicon oxide (SiOx), and wherein the second interlayer insulation film contacts the other gate electrode and is formed of silicon nitride (SiNx).

25. The display device of claim 23, wherein the second interlayer insulation film is formed with an opening, and wherein the source electrode or the drain electrode of the second TFT is disposed on a side surface of the opening.

26. The display device of claim 23, wherein the second interlayer insulation film is on the source electrode and the drain electrode of the second TFT.

* * * * *